(12) United States Patent
Kim

(10) Patent No.: US 7,843,240 B2
(45) Date of Patent: Nov. 30, 2010

(54) DELAY LOCKED LOOP CIRCUIT

(75) Inventor: Tae-Kyun Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 30 days.

(21) Appl. No.: 12/345,744

(22) Filed: Dec. 30, 2008

(65) Prior Publication Data

US 2010/0052748 A1 Mar. 4, 2010

(30) Foreign Application Priority Data

Sep. 2, 2008 (KR) ...................... 10-2008-0086111

(51) Int. Cl.
*H03L 7/06* (2006.01)
(52) U.S. Cl. ...................... 327/158; 327/149
(58) Field of Classification Search ................. 327/149, 327/159
See application file for complete search history.

(56) References Cited

U.S. PATENT DOCUMENTS

| | | | | |
|---|---|---|---|---|
| 7,253,668 B2 * | 8/2007 | Johnson | ...................... | 327/158 |
| 7,375,565 B2 * | 5/2008 | Kwak | .......................... | 327/158 |
| 7,414,445 B2 * | 8/2008 | Heyne | ........................ | 327/158 |
| 7,605,623 B2 * | 10/2009 | Yun et al. | ................... | 327/158 |
| 7,649,389 B2 * | 1/2010 | Bae | ............................. | 327/158 |
| 2010/0039148 A1 * | 2/2010 | Petrie | ......................... | 327/149 |
| 2010/0060335 A1 * | 3/2010 | Kwak et al. | ................. | 327/158 |

FOREIGN PATENT DOCUMENTS

| | | |
|---|---|---|
| KR | 1020010065899 A | 7/2001 |
| KR | 1020020002565 A | 1/2002 |
| KR | 1020030025326 A | 3/2003 |
| KR | 1020050013737 A | 2/2005 |

OTHER PUBLICATIONS

Notice of Preliminary Rejection issued from Korean Intellectual Property Office on Nov. 27, 2009.
Notice of Allowance issued from Korean Intellectual Property Office on Apr. 20, 2010.

* cited by examiner

*Primary Examiner*—Lincoln Donovan
*Assistant Examiner*—Adam D Houston
(74) *Attorney, Agent, or Firm*—IP & T Group LLP

(57) ABSTRACT

A delay locked loop circuit includes a delay locking unit configured to output an internal clock by delaying a reference clock as much as a first delay amount in response to a phase comparison result of comparing a phase of the reference clock with a phase of a feedback clock that is generated based on delay modeling of a semiconductor memory device, and a noise sensor configured to control variation of the first delay amount caused by an external noise to be less than a second delay amount after locking the internal clock.

10 Claims, 4 Drawing Sheets

DELAY LOCKED LOOP CIRCUIT

CROSS-REFERENCE TO RELATED APPLICATIONS

The present invention claims priority of Korean patent application number 10-2008-0086111, filed on Sep. 2, 2008 which is incorporated by reference in its entirety.

BACKGROUND OF THE INVENTION

The present invention relates to a delay locked loop circuit, and more particularly, to a delay locked loop circuit having improved external noise characteristics.

In general, a delay locked loop DLL is a circuit that controls a timing of outputting data from a synchronous memory device using an external clock inputted from the outside of the synchronous memory device.

In order to transmit data from the semiconductor memory device to a chipset without an error, the semiconductor memory device and the chipset are synchronized with the external clock. However, the external clock inputted to the semiconductor memory device is delayed by an internal circuit of the semiconductor memory device. Therefore, a phase difference between the external clock and the internal clock occurs. The DLL removes a phase difference between a clock and data output from the semiconductor memory device by compensating a clock skew generated in the internal circuit of the semiconductor memory device.

FIG. 1 is a block diagram illustrating a delay locked loop according to the related art.

As shown, the delay locked loop according to the related art includes a phase comparator 101, a delay controller 103, a delay unit 105, and a replica model unit 107.

The phase comparator 101 compares a phase of an external clock EXT_CLK with a phase of a feedback clock FB_CLK output from the replica model unit 107, which is generated by modeling a clock delay component inside a semiconductor memory device, and outputs a phase comparison signal CMP that denotes a phase difference between the external clock EXT_CLK and the feedback clock FB_CLK. The delay controller 103 determines a delay amount of an internal clock in response to the phase comparison signal CMP and outputs a delay control signal DELAY to the delay unit 105. The delay unit 105 delays the external clock EXT_CLK as much as a first delay amount DD_1 (see FIG. 2) in response to the delay control signal DELAY and outputs the delayed external clock as an internal clock CLK_OUTFIG. The internal clock CLK_OUT is inputted to the replica model unit 107, which, for example, replicates physical properties of a semiconductor device with respect to signal delays.

Finally, a phase of the feedback clock from the replica model unit 107 is synchronized with a phase of the external clock EXT_CLK by reflecting the delay of the delay unit 105 and the replica model unit, which replicates physical properties of a semiconductor device with respect to signal delays. Here, the internal clock CLK_OUT delayed from the delay unit 105 is locked.

Meanwhile, delay may be caused by elements of the delay locked loop circuit due to a power noise (for example, a supply voltage may be abruptly reduced). When a supply voltage, that drives a delay looked loop circuit, is drastically reduced, the elements of the delay locked loop circuit cannot be driven normally with this supply voltage. On the other hand, if the supply voltage for driving the delay locked loop increases, a signal inputted to the elements of the delay locked loop circuit may be outputted with a reduced delay amount.

If the external noise is continuously inputted to the delay locked loop circuit, the external clock EXT_CLK is delayed only when the external noise is inputted. However, unlike the delay amount of the external clock EXT_CLK, the delay amount of the feedback clock FB_CLK is accumulated because the feedback clock FB_CLK is generated with delay reflected by the delay unit 105 and the replica model unit 107 which are influenced by the external noise. Finally, the feedback clock FB_CLK is delayed as much as a third delay amount DD_3 (see FIG. 2), which is an amount of delay caused by the continuously inputted external noise, and inputted to the phase comparator 101. Therefore, the phase comparator 101 reflects the delay amount of the feedback clock FB_CLK caused by the external noise and outputs the phase comparison signal CMP. Finally, the internal clock CLK_OUT is locked with the unintended delay amount caused by the external noise.

FIG. 2 is a timing diagram illustrating operation of a delay locked loop circuit of FIG. 1. FIG. 2 shows the influence of power noise on a locking process of an internal clock CLK_OUT.

When the delay locked loop circuit operates initially, the external clock EXT_CLK is not delayed by the delay unit 105 because the delay amount of the delay unit 105 is under a reset state. Therefore, a phase of the external clock EXT_CLK is not synchronized with a phase of the internal clock CLK_OUT. A phase of the feedback clock FB_CLK output from the replica model unit 107 is different from a phase of the external clock EXT_CLK by as much as a first delay amount DD_1 of the replica model unit 107 since there is no delay through the delay unit 105 initially. The phase comparator 101 detects the phase difference between the feedback clock FB_CLK and the external clock EXT_CLK and outputs the phase comparison signal CMP to the delay controller 103. The delay controller 103 determines the delay amount of the internal clock CLK_OUT in response to the phase comparison signal CMP, and the delay unit 105 delays the external clock EXT_CLK as much as the first delay amount DD_1 and outputs a delayed external clock as the internal clock CLK_ OUT.

Since the feedback clock FB_CLK is generated in response to the internal clock CLK_OUT inputted to the replica model 107, a phase of the external clock EXT_CLK is synchronized with a phase of the feedback clock FB_CLK. Here, the internal clock is locked. A phase difference between the internal clock CLK_OUT and the external clock EXT_CLK is a first phase difference DD_1 which is a phase difference of the internal clock CLK_OUT and the feedback clock FB_CLK and corresponds to a delay through the replica model 107.

If external noise is continuously inputted to the delay locked loop circuit after locking, the feedback clock FB_CLK may be delayed as much as a third delay amount DD_3 as shown. Therefore, the phase comparator 101 detects the phase difference between the external clock EXT_CLK and the feedback clock FB_CLK and outputs the phase comparison signal CMP. The delay controller 103 outputs the delay control signal DELAY for reducing the delay amount of the internal clock CLK_OUT to the delay unit 105 in response to the phase comparison signal CMP. The delay unit 105 outputs the internal clock CLK_OUT of which the delay amount is reduced as much as the third delay amount DD_3. Finally, the internal clock CLK_OUT is locked with a smaller delay amount than the first delay amount DD1 to compensate for the external noise.

If the external noise disappears, the delay amount of the feedback clock FB_CLK is reduced as much as the third delay amount DD_3, and the internal clock CLK_OUT may be locked as the first delay amount DD_1 again by the locking process.

Finally, if an external noise such as a power source noise is inputted, the internal clock CLK_OUT is locked with an unintended delay amount. Until the internal clock CLK_OUT is locked after the external noise disappears, the skew of the external clock EXT_CLK and the internal clock CLK_OUT is caused by the external noise when the semiconductor memory device outputs data, and the data output from the semiconductor memory device may have an error.

SUMMARY OF THE INVENTION

Some embodiments of the present invention are directed to providing a delay locked loop circuit for reducing data output errors of a semiconductor memory device by reducing a skew of an external clock and an internal clock through controlling variation of a delay amount of an internal clock, which is caused by external noise, to be less than a predetermined delay amount and by rapidly relocking the internal clock when external noise disappears.

In accordance with an aspect of the present invention, there is provided a delay locked loop circuit including a delay locking unit configured to output an internal clock by delaying a reference clock as much as a first delay amount in response to a phase comparison result of comparing a phase of the reference clock with a phase of a feedback clock that is generated based on a delay modeling of a semiconductor memory device, and a noise sensor configured to control variation of the first delay amount caused by an external noise to be less than a second delay amount after locking the internal clock.

In accordance with another aspect of the present invention, there is provided a delay locked loop circuit including a phase comparator configured to generate a first comparison signal by detecting a phase difference of a reference clock and a second feedback clock, a delay controller configured to decide a first delay amount in response to the first comparison signal, a first delay unit configured to output an internal clock by delaying the reference clock by as much as the first delay amount, a replica model unit configured to receive the internal clock and outputting a first feedback clock, a second delay unit configured to output the reference clock by delaying an external clock of a semiconductor memory device by as much as a second delay amount, a third delay unit configured to output the second feedback clock by delaying the first feedback clock by as much as the second delay amount, and a noise controller configured to control variation of the first delay amount by sensing whether the first delay amount varies due to an external noise or not when the internal clock is locked.

DESCRIPTION OF SPECIFIC EMBODIMENTS

Other objects and advantages of the present invention can be understood by the following description, and become apparent with reference to the embodiments of the present invention.

Figure 3:
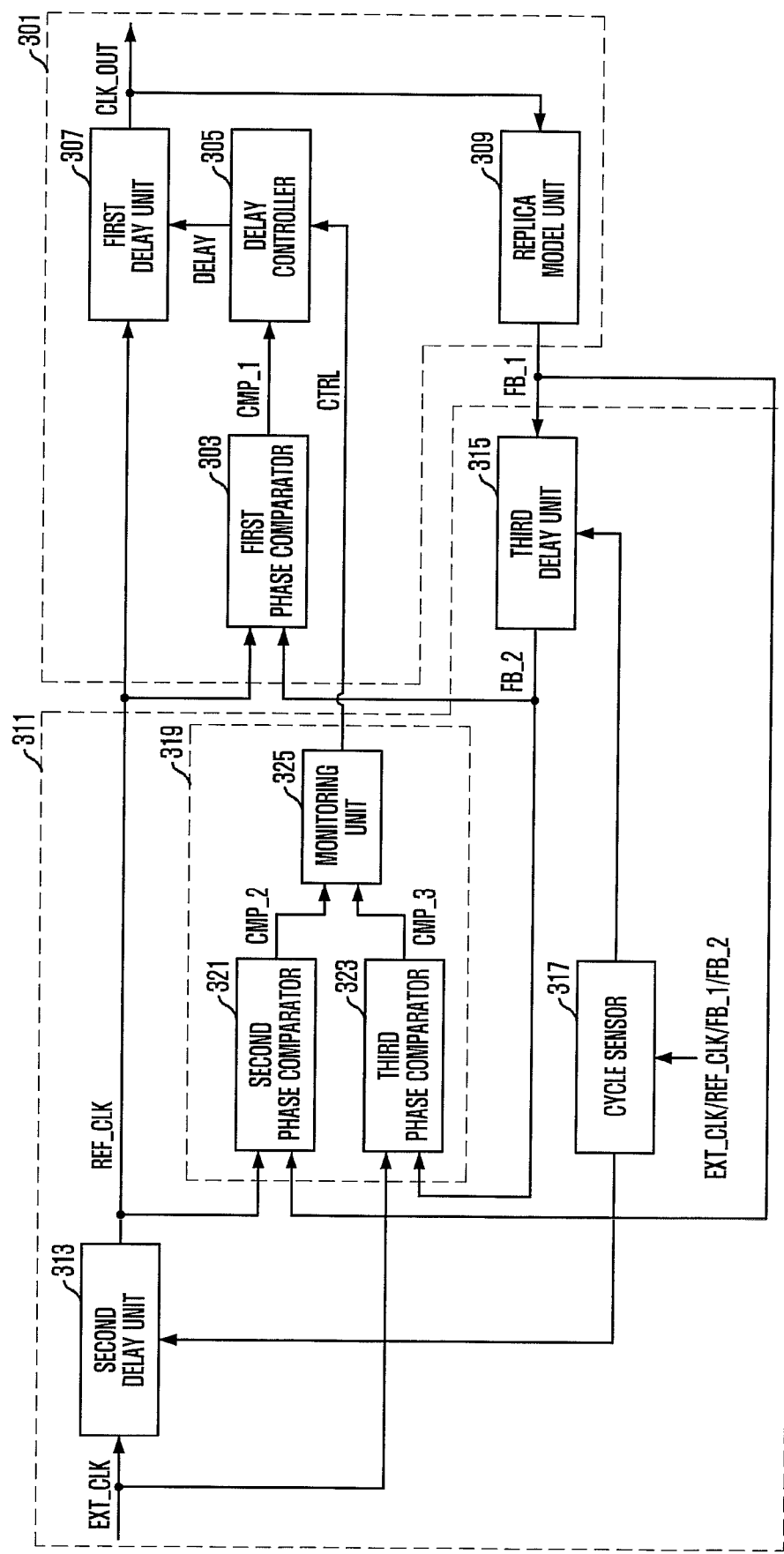
FIG. 3 is a block diagram illustrating a delay locked loop circuit in accordance with an embodiment of the present invention.

FIG. 3 is a diagram illustrating a delay locked loop circuit in accordance with an embodiment of the present invention.

As shown, the delay locked loop circuit in accordance with an embodiment of the present invention includes a delay locking unit 301 and a noise reducing unit 311.

Unlike a delay locked loop circuit according to the related art, the delay locked loop circuit according to the present embodiment includes the noise reducing unit 311. The noise reducing unit 311 operates after the internal clock CLK_OUT is locked based on a first delay amount DD_1. If the internal clock CLK_OUT is unlocked because the first delay amount DD_1 is changed as much as a third delay amount DD_3 by external noise, the maximum variation of the first delay amount DD_1 is limited to the second delay amount DD_2 in order to relock the internal clock CLK_OUT.

Therefore, the noise reducing unit 311 obtains a data margin, improves external noise characteristics, and makes the internal clock CLK_OUT to be rapidly relocked to the first delay amount DD_1 after the external noise disappears. Finally, the delay locked loop circuit in accordance with an embodiment of the present invention may enable the semiconductor memory device to output data without an error by minimizing or mitigating a skew of the external clock EXT_CLK and the internal clock CKL_OUT, which is generated from the external noise when the semiconductor memory device outputs data.

Hereafter, an operation of the delay locked loop circuit in accordance with an embodiment of the present invention will be described.

The delay locking unit 301 includes a first phase comparator 303, a delay controller 305, a first delay unit 307, and a replica model unit 309. The first phase comparator 303 compares a phase of a reference clock REF_CLK outputted from the second delay unit 313 with a phase of a second feedback clock FB_2 outputted from the third delay unit 315 and outputs a first phase comparison signal CMP_1 to the delay controller 305. Here, the first phase comparison signal CMP_1 denotes the phase difference between the reference clock REF_CLK and the second feedback clock FB_2.

The second and third delay units 313 and 315 delay the external clock EXT_CLK and the first feedback clock FB_1 as much as a second delay amount DD_2, respectively and 315 output the reference clock REF_CLK and the second feedback clock FB_2. Therefore, the phase difference between the external clock EXT_CLK and the first feedback clock FB_1 is identical to the phase difference between the reference clock REF_CLK and the second feedback clock FB_2. Meanwhile, the second and third delay units 313 and 315 are included in the noise reducing unit 311 and will be described in detail later.

The delay controller 305 determines a first delay amount DD_1 in response to the first phase comparison signal CMP_1 and outputs a delay control signal DELAY to the first delay unit 307. The first delay unit 307 delays the reference clock REF_CLK as much as the first delay amount DD_1 in response to the delay control signal DELAY and outputs an internal clock CLK_OUT. The internal clock CLK_OUT is inputted to the replica model unit 309. Finally, a phase of the second feedback clock FB_2 is synchronized with a phase of the reference clock REF_CLK through the above mentioned processes. Here, the internal clock CLK_OUT is locked based on the first delay amount DD_1.

The noise reducing unit 311 operates after the internal clock CLK_OUT is locked and includes a second delay unit 313, a third delay unit 315, a cycle sensor 317 and a noise controller 319.

As shown in FIG. 3, the second and third delay units 313 and 315 delay an input signal as much as a second delay amount DD_2 so that the second and third phase comparators 321 and 323 detect a phase difference corresponding to the second delay amount DD_2. The second delay unit 313 delays the external clock EXT_CLK as much as the second delay amount DD_2 and outputs the reference clock REF_CLK. The third delay unit 315 delays the first feedback clock FB_1 output from the replica model unit 309 as much as the second delay amount DD_2 and outputs a second feedback clock FB_2. The second and third delay units 313 and 315 each delays an input signal regardless of locking.

The noise controller 319 compares a phase of the external clock EXT_CLK with a phase of the second feedback clock FB_2, compares a phase of the reference clock REF_CLK with a phase of the first feedback clock FB_1, and senses whether the variation of the first delay amount DD_1 is greater than the second delay amount DD_2 or not. If the variation of the first delay amount DD_1 is greater than the second delay amount DD_2, the delay controller 305 is disabled.

The noise controller 319 includes a second phase comparator 321, a third phase comparator 323, and a monitoring unit 325.

The second phase comparator 321 senses whether the variation of the first delay amount DD_1 is greater than the second delay DD_2 by comparing the phase of the reference clock REF_CLK with the phase of the first feedback clock FB_1. The noise sensor 311 operates after the internal clock CLK_OUT is locked based on the first delay amount DD_1 as described above. If the internal clock CLK_OUT is locked, the phase of the reference clock REF_CLK is synchronized with the phase of the second feedback clock FB_2. The second feedback clock FB_2 is delayed as much as the second delay amount DD_2, compared to the first feedback clock FB_1. Accordingly, the reference clock REF_CLK is delayed as much as the second delay amount DD_2, compared to the first feedback clock FB_1. If the phase of the reference clock REF_CLK is ahead of a phase of the first feedback clock FB_1 because the first feedback clock FB_1 is delayed by the external noise, the second phase comparator 321 enables the second phase comparison signal CMP_2 and outputs the enabled second phase comparison signal CMP_2 to the monitoring unit 325.

The monitoring unit 325 disables the delay controller 305 in response to the second phase comparison signal CMP_2. That is, if the variation of the first delay amount DD_1 is greater than the second delay amount DD_2 due to continuously inputted external noise, the monitoring unit 325 disables the delay controller 305.

If the delay controller 305 is disabled, a delay control signal DELAY corresponding to a delay amount right before disabling the delay controller 305 is transferred to the first delay unit 307. Therefore, the variation of the first delay amount DD_1 does not increase to be greater than the second delay amount DD_2.

The third phase comparator 323 senses whether the variation of the first delay amount DD_1 is greater than the second delay amount DD_2 or not by comparing the external clock EXT_CLK with the second feedback clock FB_2. Similar to phase relation between the reference clock REF_CLK and the first feedback clock FB_1, the second feedback clock FB_2 is delayed as much as the second delay amount DD_2 compared to the external clock EXT_CLK. If the phase of the second feedback clock FB_2 is ahead of the phase of the external clock EXT_CLK because the delay amount of the second feedback clock FB_2 is reduced according to the reduction of the delay amount of the first feedback clock FB_1 that is generated due to the external noise, the third phase comparator 323 enables the third comparison signal CMP_3 and outputs the enabled comparison signal CMP_3 to the monitoring unit 325. The monitoring unit 325 disables the delay controller 303 in response to the third comparison signal CMP_3. Therefore, the variation of the first delay amount DD_1 is not reduced by more than the second delay amount DD_2.

Finally, the delay locked loop circuit in accordance with an embodiment of the present invention controls the variation of the first delay amount DD_1 to be less than the second delay amount DD_2 by improving the external noise characteristics although the external noise is inputted to the delay locked loop circuit. Therefore, the delay locked loop circuit in accordance with an embodiment of the present invention may reduce the data output error of the semiconductor memory device by reducing a skew of the external clock EXT_CLK and the internal clock CLK_OUT and rapidly relocking the internal clock CLK_OUT when the external noise disappears.

Meanwhile, the cycle sensor 317 senses a clock cycle in the delay locked loop circuit and controls the second delay amount DD_2 by controlling the second and third delay units 313 and 315. In general, the longer the clock cycle is, the greater the data margin becomes. Therefore, it makes no difference if the second delay amount DD_2 increases as much as the extension of the clock cycle. Since the clock cycles in the delay locked loop circuit such as the external clock EXT_CLK, the reference clock REF_CLK, the first feedback clock FB_1 and the second feedback clock FB_2, are the same, the cycle sensor 317 senses a clock cycle by receiving one of the clocks.

Figure 1:
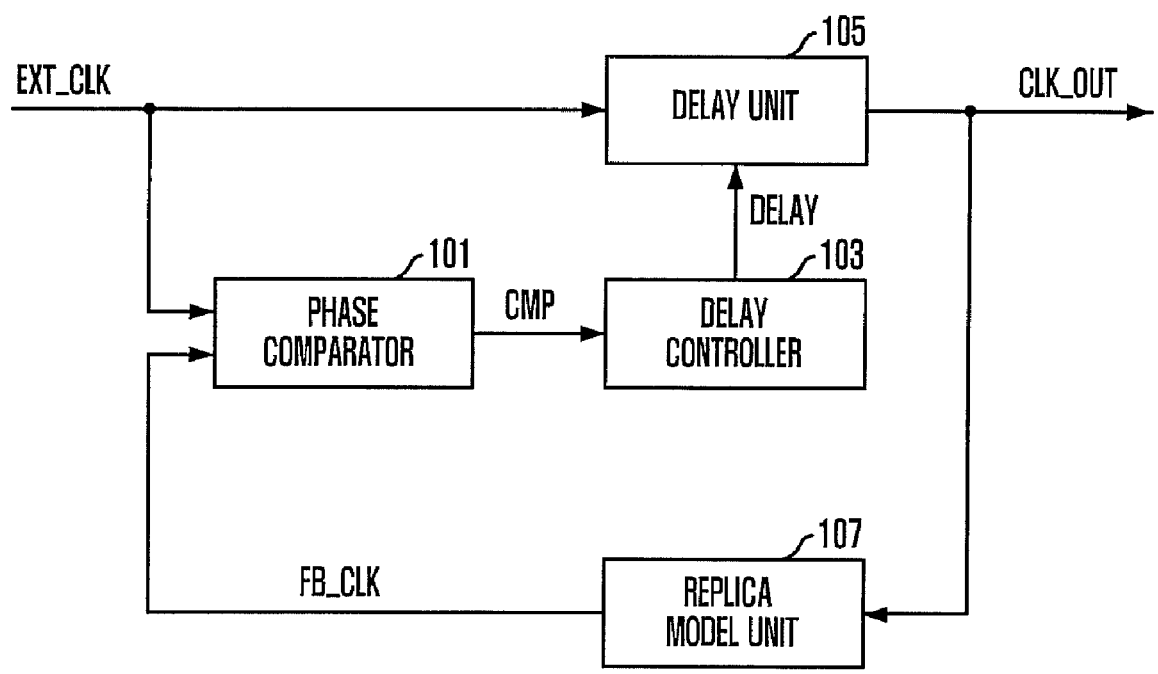
FIG. 1 is a block diagram illustrating a delay locked loop circuit according to the related art.
Figure 2:
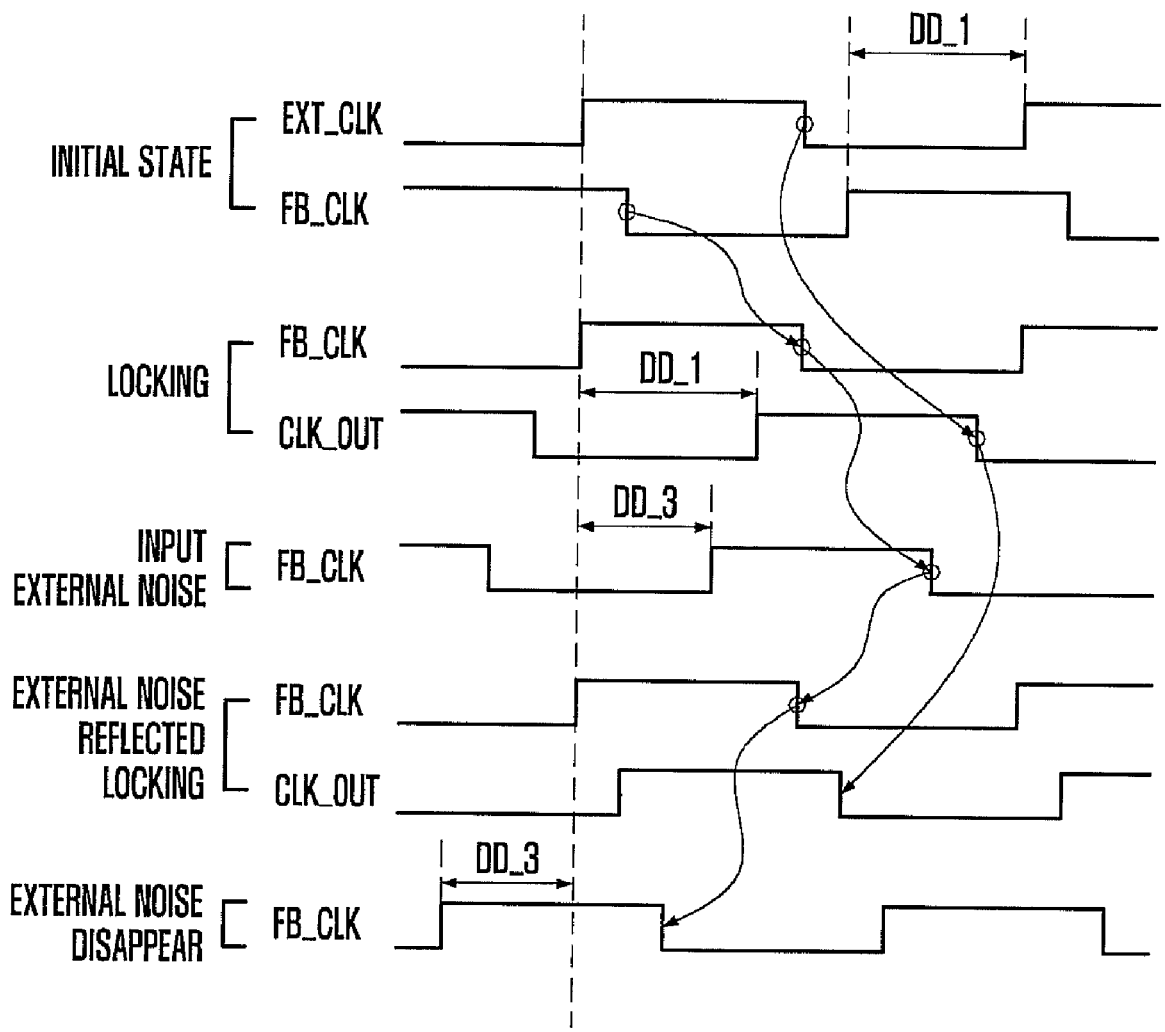
FIG. 2 is a timing diagram illustrating an operation of a delay locked loop circuit of FIG. 1.
Figure 4:
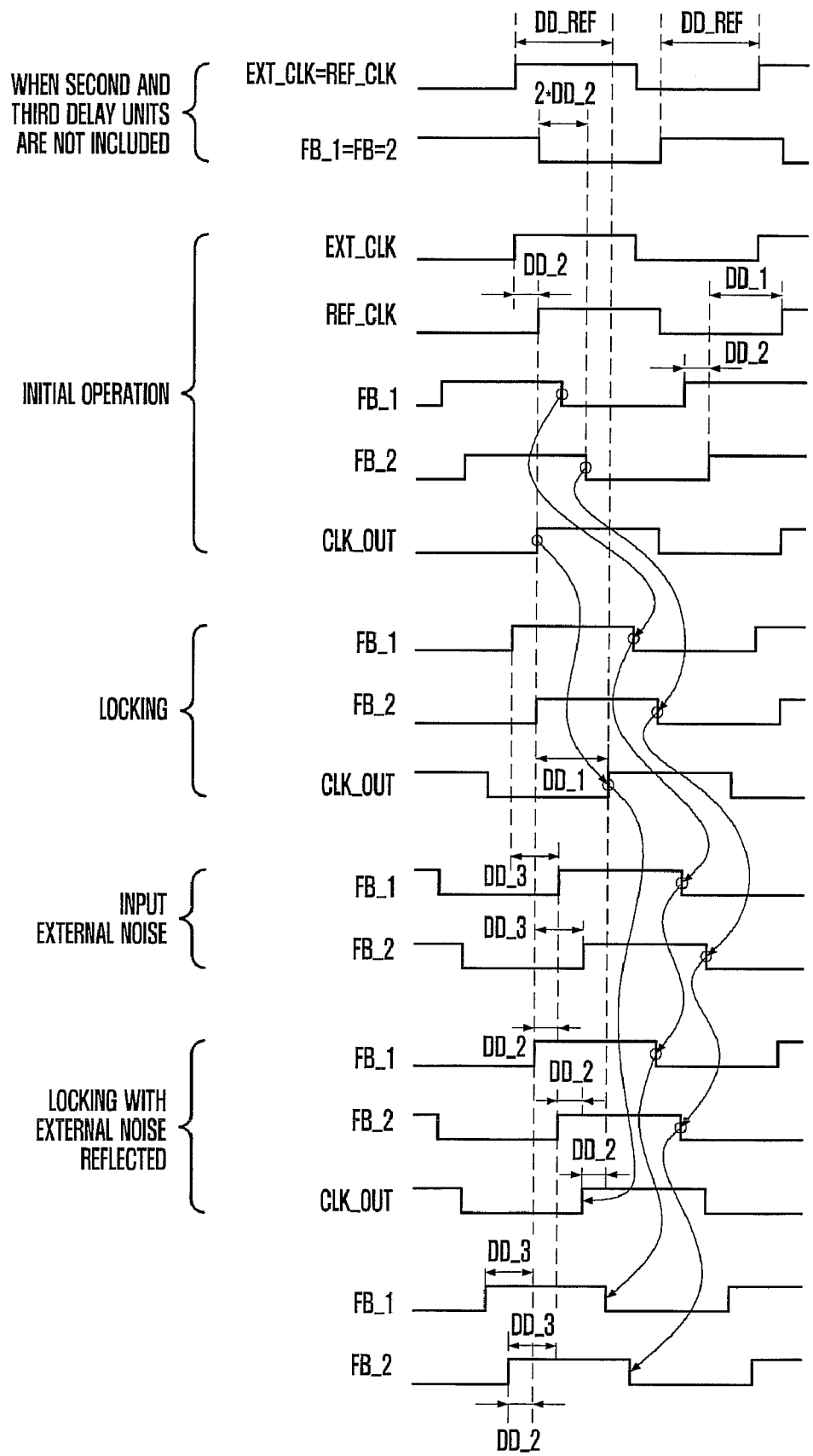
FIG. 4 is a timing diagram illustrating operations of a delay locked loop circuit of FIG. 3.

FIG. 4 is a timing diagram for describing an operation of a delay locked loop circuit shown in FIG. 3. The timing diagram shows a case in which the delay amount of the first and second feedback clocks FB_1 and FB_2 increases as much as the third delay amount DD_3 by the continuously inputted external noise like FIG. 2.

At an initial stage, the reference clock REF_CLK is delayed by the second delay unit 313 compared to the external clock EXT_CLK, and the second feedback clock FB_2 is delayed by the third delay unit 313 as much as the second delay amount DD_2 compared to the first feedback clock FB_1. The reference clock REF_CLK is not delayed by the first delay unit 307, and a waveform of the reference clock REF_CLK is identical to that of the internal clock CLK_OUT.

Since the phase difference between the reference clock REF_CLK and the second feedback clock FB_2 is the first delay amount DD_1, the internal clock CLK_OUT is locked after it is delayed as much as the first delay amount DD_1 from the reference clock REF_CLK.

Meanwhile, if it is assumed that the second and third delay units 313 and 315 are excluded from the noise reducing unit 311, a phase of the external clock EXT_CLK is identical to a phase of the reference clock REF_CLK, and a phase of the first feedback clock FB_1 is identical to a phase of the second feedback clock FB_2. A phase difference of the external clock EXT_CLK and the first feedback clock FB_1 is about a reference delay amount DD_REF. However, in an embodiment of the present invention, the reference clock REF_CLK is delayed as much as the second delay amount DD_2 by the second delay unit 313, and the second feedback clock FB_2 generated from the reference clock REF_CLK is further delayed as much as the second delay amount DD_2 by the third delay unit 315. That is, since the second and third delay units 313 and 315 are included in the noise reducing unit 311 in accordance with an embodiment of the present invention, the second feedback clock FB_2 is delayed as twice much as the second delay amount DD_2 in case that the second and third delay units 313 and 315 are included in the noise reducing unit 311 than in case that the second and third delay units 313 and 315 are excluded from the noise reducing unit 311. Therefore, a phase difference between the reference clock REF_CLK and the second feedback clock FB_2 is about the first delay amount DD_1 which is equivalent to a result of subtracting the second delay amount DD_2 from the reference delay amount DD_REF. Finally, the internal clock CLK_OUT is locked after it is delayed as much as the reference delay amount DD_REF from the external clock EXT_CLK in the delay locked loop circuit in accordance with an embodiment of the present invention.

As described above, the first feedback clock FB_1 and the second feedback clock FB_2 are delayed as much as the third delay amount DD_3 due to the continuously inputted external noise. Therefore, the first phase comparator 303 detects a phase difference between the reference clock REF_CLK and the second feedback clock FB_2 and outputs the first phase comparison signal CMP_1. The delay controller 305 outputs a delay control signal DELAY to the first delay unit 307 for reducing the delay amount of the internal clock CLK_OUT. The first delay unit 307 begins reducing the delay amount of the internal clock CLK_OUT in response to the delay control signal DELAY.

If the delay amount of the internal clock CLK_OUT is reduced, the delay amount of the first and second feedback clocks FB_1 and FB_2 is reduced too. If a phase of the reference clock REF_CLK is ahead of a phase of the first feedback clock FB_1, the second phase comparator 321 senses it and enables the second phase comparison signal CMP_2. The monitoring unit 325 enables a control signal CTRL in response to the enabled second comparison signal CMP_2, and the delay controller 305 is disabled in response to the control signal CTRL. Finally, since the second phase comparator 321 enables the second phase comparison signal CMP_2 if a phase difference between the reference clock REF_CLK and the first feedback clock FB_1 is greater than the second delay amount DD_2, the delay amount of the internal clock CLK_OUT is not reduced by more than the second delay amount DD_2 which is smaller than the third delay amount DD_3. Since the first feedback clock FB_1 and the second feedback clock FB_2 are generated from the internal clock CLK_OUT, the delay amount of the first feedback clock FB_1 and the second feedback clock FB_2 is not reduced by more than the second delay amount DD_2 too.

Then, if the external noise disappears, the delay amount of the first feedback clock FB_1 and the second feedback clock FB_2 is reduced as much as the third delay amount DD_3, which is a delay amount caused by the external noise. Since the delay amount of the first feedback clock FB_1 and the second feedback clock FB_2 generated from the external noise is reduced as much as the second delay amount DD_2, the phase of the reference clock REF_CLK is ahead of the phase of the second feedback clock FB_2 as much as the second delay amount DD_2. Therefore, the internal clock CLK_OUT is delayed more as much as the second delay amount DD_2 which is the phase difference between the reference clock REF_CLK and the second feedback clock Fb_2 and locked as the first delay amount DD_1.

Finally, the variation of the first delay amount DD_1 is controlled to be less than the second delay amount DD_2 although the external noise is inputted, and the internal clock CLK_OUT is locked rapidly after the external noise disappears.

While the present invention has been described with respect to the specific embodiments, it will be apparent to those skilled in the art that various changes and modifications may be made without departing from the spirit and scope of the invention as defined in the following claims.

Embodiments of the present invention relate to a delay locked loop circuit which controls the variation of the delay amount of the internal clock, which is caused by the external noise, to be less than a predetermined delay amount. The delay locked loop circuit in accordance with an embodiment of the present invention may have improved external noise characteristics and reduce a data output error of a semiconductor memory device by reducing a skew of the external clock and the internal clock despite the external noise being inputted.

What is claimed is:

1. A delay locked loop circuit, comprising:
a delay locking unit configured to output an internal clock by delaying a reference clock as much as a first delay amount in response to a phase comparison result of comparing a phase of the reference clock generated by delaying an external clock for a second delay amount with a phase of a feedback clock generated in response to delay modeling of a semiconductor memory device; and
a noise sensor configured to control variation of the first delay amount caused by an external noise to be less than the second delay amount after locking the internal clock, wherein the noise sensor includes:
a first phase comparator configured to generate a first phase comparison signal that is enabled when phases of the external clock and the feedback clock are inverted; and
a monitoring unit configured to disable variation of the first delay amount when the first phase comparison signal is enabled.

2. The delay locked loop circuit of claim 1, wherein the delay modeling of the semiconductor memory device includes delaying the internal clock signal by the second delay amount.

3. The delay locked loop circuit of claim 2, wherein the noise sensor further including a second phase comparator for generating a second phase comparison signal that is enabled when the reference clock is in advance by the second delay amount than compared to the feedback clock, and wherein the monitoring unit disables variation of the first delay amount when the second phase comparison signal is enabled.

4. The delay locked loop circuit of claim 2, wherein the noise sensor further including a cycle sensor for controlling the variation in response to a clock cycle in the delay locked loop circuit.

5. The delay locked loop circuit of claim 1, wherein the noise sensor is configured to secures a data margin of the semiconductor memory device as much as the second delay amount.

6. A delay locked loop circuit comprising:
a phase comparator configured to generate a first comparison signal by detecting a phase difference of a reference clock and a second feedback clock;
a delay controller configured to decide a first delay amount in response to the first phase comparison signal;

a first delay unit configured to output an internal clock by delaying the reference clock as much as the first delay amount;

a replica model unit configured to receive the internal clock and output a first feedback clock;

a second delay unit configured to output the reference clock by delaying an external clock of a semiconductor memory device as much as a second delay amount;

a third delay unit configured to output the second feedback clock by delaying the first feedback clock as much as the second delay amount; and a noise controller configured to control variation of the first delay amount by sensing whether the first delay amount varies due to an external noise or not when the internal clock is locked.

7. The delay locked loop circuit of claim 6, wherein the delay locked loop circuit further including a cycle sensor for controlling the variation according to a cycle of the external clock.

8. The delay locked loop circuit of claim 7, wherein the noise controller includes:

a first phase comparator configured to generate a second phase comparison signal that is enabled when the external clock advances the second feedback clock in phase;

a second phase comparator configured to generate a third comparison signal that is enabled when the reference clock advances the first feedback clock in phase; and a monitoring unit configured to disable the delay controller when the second phase comparison signal or the third comparison signal is enabled.

9. The delay locked loop circuit of claim 7, wherein the second delay amount increases as a cycle of the external clock extends.

10. The delay locked loop circuit of claim 7, wherein noise controller is configured to obtain a data margin of the semiconductor memory device as much as the second delay amount.

* * * * *